Jan. 13, 1970 B. L. FRESCURA ET AL 3,489,961

MESA ETCHING FOR ISOLATION OF FUNCTIONAL ELEMENTS IN INTEGRATED CIRCUITS

Filed Sept. 29, 1966

INVENTORS.
BERT L. FRESCURA,
JON M. SCHROEDER.
BY [signature] &
[signature]
ATTORNEYS.

United States Patent Office 3,489,961

Patented Jan. 13, 1970

3,489,961

MESA ETCHING FOR ISOLATION OF FUNCTIONAL ELEMENTS IN INTEGRATED CIRCUITS

Bert L. Frescura, Mountain View, and Jon M. Schroeder, Los Altos, Calif., assignors to Fairchild Camera and Instrument Corporation, Syosset, N.Y., a corporation of Delaware Filed Sept. 29, 1966, Ser. No. 582,814
Int. Cl. H01l 7/00, 9/00
U.S. Cl. 317—235 6 Claims

ABSTRACT OF THE DISCLOSURE

An integrated circuit structure comprising a plurality of semiconductor devices wherein the devices are electrically isolated from each other by mesa etching. A depression is provided for indicating the depth of the deepest of the devices. Ohmic contact may be made to the interconnections at the surface uncovered by the etching.

This invention relates to an improvement in the isolation of components in integrated circuits. In particular, in accordance with this invention, isolation between various circuit elements is achieved by empty grooves extending through and surrounding the semiconductor material wherein the elements are formed.

There have been a number of prior art approaches to the problem of isolating the elements that form an integrated circuit. The term "integrated circuit" as employed herein includes thin-film integrated circuits as well as semiconductor monolithic and hybrid integrated circuits. One prior art approach, disclosed in U.S. Patent No. 3,158,788, issued to J. T. Last on Nov. 24, 1964, and assigned to the assignee of this invention, employs a barrier of added dielectric insulating material to isolate the elements of the circuit. While this method has definite advantages, it does not provide maximum element densities. Other prior art patents, such as U.S. Patent No. 3,100,276, issued to O. L. Meyer on Aug. 6, 1963, and U.S. Patent No. 3,189,798, issued to C. E. Benjamin on June 15, 1965, have attempted various arrangements of troughs alone or in combination with P-N junctions to in part isolate the elements of an integrated circuit.

This invention overcomes prior art difficulties and shortcomings by providing an integrated circuit structure comprising a monocrystalline semiconductor region having a first surface and a second surface, a plurality of circuit elements formed in the region and extending to the first surface with interconnections formed on the first surface, a substrate member in supporting relationship to the first surface, a plurality of empty grooves extending from the second surface to the first surface and electrically isolating the elements, and means for indicating the approximate depth of the deepest of said elements located in proximity to said elements.

The invented method of forming the integrated circuit comprises forming an integrated circuit on temporary support member, said integrated circuit having a first surface, a second surface adjacent said temporary support member, a plurality of elements extending to said first surface, and a means for indicating the approximate depth of the deepest of said elements formed in the integrated circuit; and removing material from the temporary support member until the indicating means is detectable and the second surface is approached.

Figure 5:
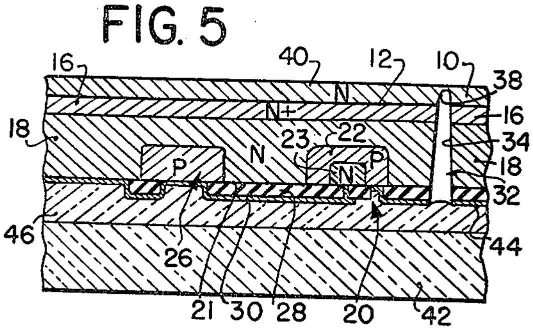
Figure 6:
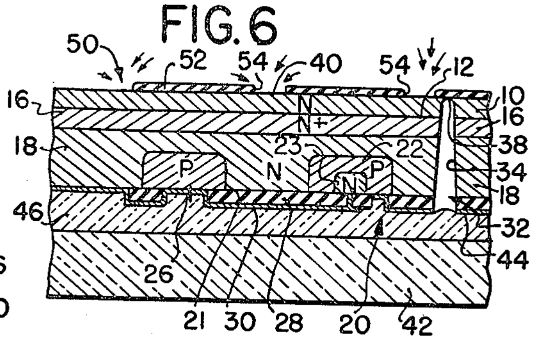
Figure 7:
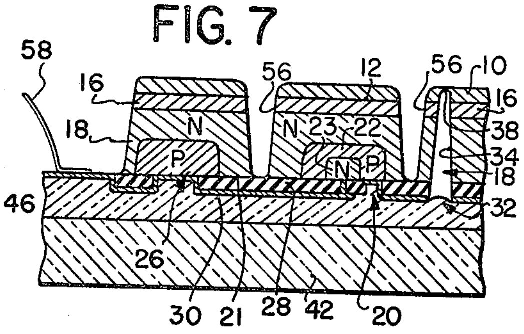

The invention is illustrated as to the improved process and the improved integrated circuit structure in the accompanying drawings, wherein:

FIGS. 1–7 illustrate the improve integrated circuit at various stages of manufacture in accordance with the process of this invention, FIG. 7 showing the completed structure.

Considering the process of this invention and referring to FIGS. 1–7, the manufacture of an improved circuit includes the initial preparation of a temporary support member 10, such as a wafer of monocrystalline silicon of a first conductivity type (e.g., n-type). The temporary support member 10 has surfaces 12 and 14, which are generally parallel. This member functions to provide support for the integrated circuit during part of the processing. Eventually a substantial portion of this member is removed and its support function then becomes relatively unimportant.

Figure 1:
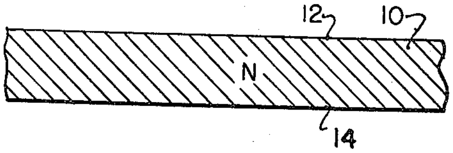
Figure 2:
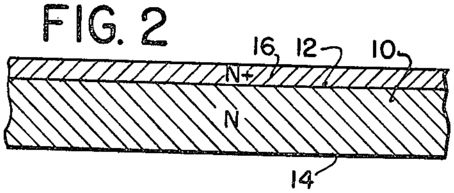

On surface 12 an epitaxial layer 16 is formed having a low resistivity and a conductivity type which may be the same or opposite to the conductivity type of temporary support member 10 (FIG. 2). The example uses low resistivity n-type material (n+). As is well known in the transistor art, the layer 16 is employed to reduce the collector resistance. The forming of epitaxial layer 16 is described in such publications as U.S. Patent No. 3,165,811. It is of course understood that, if desired, the layer 16 may be formed by other processing techniques, e.g., by the diffusion of a suitable impurity into member 10.

Figure 3:
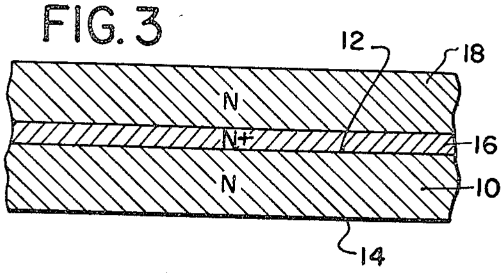

Following the formation of layer 16, a first monocrystalline region 18 is formed atop epitaxial layer 16 having a conductivity type (e.g., n-type) which is preferably the same type as epitaxial layer 16 and temporary support layer 10 in the example, but which may be opposite from that of temporary support member 10 (FIG. 3). First region 18, like epitaxial layer 16, may be formed by epitaxial deposition techniques. The region 18 may have a thickness of under 50 microns and, typically, in the range of under 20 microns, while epitaxial layer 16 may have a thickness of under 10 microns and, typically, under 2 microns. The region 18 functions as a region wherein or whereupon the elements of the integrated circuit are formed. In this regard the epitaxial layer 16 contributes to the functioning of the elements formed in region 18, and when included in an integrated circuit may be regarded as a part of region 18. Of course, it is within the scope of the invention to omit region 16, in which case support member 10 and region 18 may be a single unitary monocrystalline semiconductor member having the required thickness to afford adequate support for the integrated circuit during part of the processing.

Figure 4:
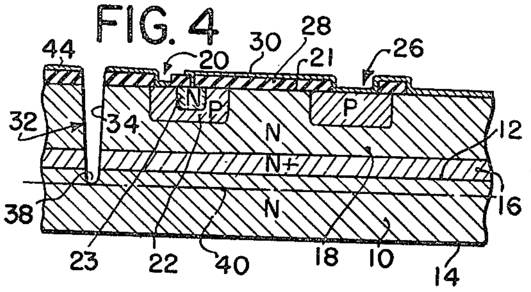

With the composite structures 10, 16 and 18 formed as shown in FIG. 3, the individual devices forming the integrated circuit complex are formed as shown in FIG. 4. Although a substantial number of circuit complexes and devices may be formed in region 18, the following description is reference to a complex having only two devices in the interest of simplicity of explanation. For example, by the controlled diffusion of selected impurities into region 18, it is well known that in a single region, a large plurality of semiconductor devices such as diodes and transistors may be fabricated. FIG. 4 illustrates an integrated circuit wherein a transistor 20 and a diode 26 have been formed in region 18. The transistor 20 may be formed by the controlled diffusion of a selected impurity into the first face or surface 21 of region 18 to form a base region 22 and the subsequent and more limited area diffusion of an impurity of opposite conductivity type into base region 22 to form an emitter region 23. The region 18, as previously mentioned, itself has a suitable impurity disposed therethrough to impart the desired conductivity type so that it may function along with layer 16 as the collector of transistor 20. Similarly, the diode 26 may be formed by diffusion of an appropriate impurity. During the manufacturing of transistor 20 and diode 26, as well as thereafter, it is preferred that the region 18 along with the junction formed therein be protected by a coating material 28. In the instance where region 18 is to be formed of monocrystalline silicon, this exterior coating may comprise a silicon oxide, such as silicon dioxide or monoxide, which has been found to be highly advantageous as a protective material. Coating 28 should have appropriate electrical characteristics in order to properly isolate the electrical connections which are located thereon from the remaining portions of the circuit.

Subsequent to the completion of the diffusion of selected impurities into region 18, there are formed openings through the protective coating 28 atop region 18 for the communication with separate portions of transistor 20 and diode 26 to provide contacts thereto for masking electrical connections. These openings as shown in FIG. 4 may be produced by suitable photoengraving and etching operations which are well known in the art. Forming of the electrical connections and contact to the elements of the integrated circuit may be accomplished by the deposition or plating of a suitable conductive metal coating 30 upon the upper surface 21 of region 18. This metal coating extends through the openings in protective coating 28 to make contact with the appropriate portions of the transistor 20 and diode 26. Subsequent to the application of metal coating 30, it is selectively etched or otherwise removed to extend between desired openings to form a circuit. Such procedures for forming contacts and connections are described in detail in U.S. Patent No. 2,981,877, assigned to the same assignee as this invention.

An important step performed following the forming of metal coating 30 is the forming of means 32 for indicating the approximate depth of the elements formed in regions 16 and 18. The indicating means 32 in the illustrated embodiment takes the form of a groove 34 which may be formed by selectively removing a portion of metal coating 30, the underlying protective coating 28, and the underlying region 18 as shown in FIG. 4. This may be done by etching with an etchant or etchants adapted for removing the material of each layer being removed. It is, of course, within the scope of the invention to employ other methods for the removal of the semiconductor material incident to the formation of the groove 34. Furthermore, groove 34 may take on various geometrical configurations and may be continuous or discontinuous. It is only necessary that the groove 34 extend into the semiconductor body a depth equal to or in excess of the depth of the deepest of elements 20 and 26 (to the depth of collector region 16 of transistor 20 in the illustrated example 6). In this manner, the bottom 38 of groove 34 will become visible or otherwise detectable later in the process, as will be described below.

The integrated circuit is now inverted as shown in FIG. 5 and as much of support member 10 as is practical is removed. The removal of material from surface 14 of intermediate support member 10 is accomplished by well-known mechanical and chemical polishing of surface 14 until the bottom 38 of groove 34 becomes visible or otherwise detectable through the remaining portion of intermediate support member 10. As indicated by cut line 40 (FIGS. 3 and 4), following the removal operation, a small portion of intermediate support member 10 may remain. However, it is possible under certain circumstances to remove all of intermediate member 10.

If the removal of material from surface 14 is accomplished, at least in the final stages, by chemical etching, another type of indicating means may be used to indicate when chemical etching should be stopped. It has been discovered, in the case of circular semiconductor wafers that a "lensing" effect occurs during etching. In other words, with many (perhaps hundreds) of integrated circuits of the type shown in FIG. 5 formed on a single wafer, etching will effectively be deeper (e.g., 15 microns) at the periphery of the wafer than at the center. This is primarily due to the fact that at the periphery of the wafer the semiconductor material becomes subject to etching from both the top and side which facilitates removal of the material. This differential in etching finally results in the removal of all the semiconductor material at the periphery of the wafer and the exposure of the underlying metal pattern 30 or oxide layer 28, as the case may be, forming a peripheral rim of a different and detectable material. Further etching of the wafer will not only reduce the thickness of the wafer but will also increase the width of the peripheral rim. Since the etching continues at a substantially constant rate, the change in width of the peripheral rim will be related to the change in thickness of the wafer. Accordingly, the final thickness of the wafer may be controlled by stopping the etching whenever the width of the peripheral rim reaches a desired value. For example, a width in the order of 1/32 of an inch can be easily detected by the naked eye. Whereas there may be some damage resulting from etching into region 16 on the devices located at the extreme periphery of the wafer, it has been found that the majority of the devices in the main central portion of the wafer will be unaffected. However, it is generally common practice not to use the peripheral devices; thus, the use of this method of detection has at most only a minor effect upon yield. In this alternate method, the "indicating means" is the metal pattern 30 or oxide 28 itself, rather than a groove 32 as illustrated in FIG. 5 and described above. Thus, in accordance with this alternate method of controlling the thickness of the integrated circuit, it is possible to control the thickness of the control portion by monitoring the width of the peripheral rim.

Next, the integrated circuit is placed on final support member 42 (FIG. 5) which forms a part of the final integrated circuit assembly. The final support member 42 may take the form of a ceramic glass or a semiconductor material which preferably has a coefficient of expansion that is matched to that of the material of the integrated circuit and which adheres to surface 44 thereof. In some instances, in order to accomplish the adherence of substrate 42 to the integrated circuit and the desired matching of coefficients, it may be desirable to include an intervening layer of glass 46 (e.g., CV–430 glass). Typically, the glass layer 46 is applied to support member 42 in the molten form and the integrated circuit is positioned on the glass layer to form an assembly of substrate 42, glass layer 46 and the integrated circuit as shown in FIG. 5. With certain combinations of materials, it may be desirable to include in addition to the glass layer 46 a layer of barrier material (e.g., aluminum oxide or silicon oxide) to prevent the contamination of the integrated circuit by glass layer 46 or substrate 42. It should be noted that it is within the scope of the invention to attach substrate 42 to the integrated circuit prior to removing the material from surface 14.

Next, a mask 50 is formed on surface 40 by well-known semiconductor processing techniques. For example, in the case where temporary support member 10 is monocrystalline silicon, the surface 40 may be oxidized to form a coating 52 of silicon oxide. The coating 52 is then processed by photoengraving techniques to form openings 54 which are oriented to lie in a line between devices 20 and 26. Through the openings 54, a selective etchant, such as CP8 described in "Transistor Technology," vol. II, F. J. Bondy, page 598, is applied to rapidly etch through the regions 16 and 18 and member 10 (FIG. 6). In this respect, it is noted that any class of etchants which are rich in nitric acid are selective; CP8 being formed of 5 parts concentrated nitric acid and 3 parts concentrated hydrofluoric acid. Thus, by selective etching, it is contemplated that the etchant operates relatively rapidly on silicon or other semiconductor material and yet relatively slowly on the silicon oxide or other protective material. It will be appreciated that control of the etching of the groove through the wafer is thereby materially simplified.

As a result of the etching operation, a groove 56 is formed extending from a first surface 40 to a second surface 21 (FIG. 7) but not through the protective coating. The formed groove 56 completely surrounds one of the elements or a circuit. The phrase "completely surround" as employed herein includes having a groove part of the way around boundary of an element or circuit with the remainder of its boundary bordered by an edge. Thus, the regions 16 and 18 are divided into separate parts insofar as the semiconductor material is concerned and the semiconductor material is supported by support member 42 along with any other layers such as glass layer 46. The grooves 56 provide the isolation between the adjacent semiconductor devices. The protective coating 28 upon the surface 21 of the wafer is maintained intact throughout the process. Likewise, the electrical connection 30 placed upon the protective coating 28 and into electrical contact with different regions of the semiconductor devices is maintained intact inasmuch as the etching operation does not extend beyond the surface 21 (FIG. 7).

To complete the integrated circuit, it is now only necessary to attach the required electrical leads to the circuit. This may be accomplished by attaching conductors to the electrical interconnections formed by metal coating 30. Such conductors may take the form of electrically conductive wires, such as wire 58, bonded to the electrically conductive material 30. Alternatively, intervening glass layer 46 may be omitted. The electrical interconnections formed by metal coating 30 may make direct electrical and physical contact in registration with an appropriate printed pattern deposited or otherwise applied to the upper surface of final substrate 42. Substrate 42 must then extend laterally beyond the periphery of adjacent layer 18 to leave room for attaching wires to the metal pattern on substrate 42 at the periphery, in a manner well known in the art. The entire circuit is then tested, sorted and finally packaged.

The above-described process and resulting semiconductor device has the advantage of providing a high-packing density with isolation comparable to that achieved by junction isolation or added dielectric material isolation. The increased packing density is achieved by making the semiconductor material associated with the semiconductor devices as thin as possible by the inclusion of indicating means which indicate the approximate depth of the devices. With the semiconductor material contained in the semiconductor devices made as thin as possible, the etching process forms a groove with a much narrower width, thus increasing the packing density achievable. In addition, the above process enables the semiconductor devices to be formed on a relatively flat surface, whereby precise etching, photoengraving and diffusion techniques may be employed. Further, the process is consistent with the formation of epitaxial devices, and silicon technology provides precise thinness control and requires no additional dielectric material.

Although this invention has been disclosed and illustrated with reference to particular applications, the principles involved are susceptible of numerous other applications which will be apparent to persons skilled in the art. For example, the method is equally applicable to the manufacture of discrete devices, e.g., transistors, diodes, resistors, etc. Of course, if the method is used to manufacture such devices then the grooves are merely used to isolate the discrete components from one another on the water and the metal conductor pattern will not interconnect the various devices. The invention is, therefore, to be limited only as indicated by the scope of the appended claims:

What is claimed is:

1. An integrated circuit structure comprising:

a plurality of spaced semiconductor devices having a first and a second surface;

a plurality of semiconductor regions of different conductivity types located in each device with a PN junction formed between each region, each PN junction having an edge at the first surface;

a layer of protective oxide overlying the first surface to protect the surface edge of the PN junctions from contamination;

a plurality of interconnect layers located upon and adherent to portions of the protective oxide, the oxide layer formed to allow selected portions of the interconnect layers to extend therethrough to the first surface to make electrical contact to selected semiconductor regions in the devices;

a substrate member supporting said semiconductor devices via the first surface thereof;

a plurality of empty grooves extending from said second surface to said first surface and electrically isolating said devices from each other; and, a groove within at least one of said devices, said groove extending from said first surface at least to said second surface.

2. The structure recited in claim 1, wherein at least one of said grooves extending from said second to said first surface surrounds at least one of said devices.

3. The structure recited in claim 2, wherein said regions include an epitaxial layer.

4. The structure recited in claim 1, further defined by a means for making ohmic contact to said interconnections along said first surface.

5. The structure recited in claim 4 wherein said means comprises an electrically conductive wire bonded to said interconnections along said first surface.

6. The structure recited in claim 4 wherein said means comprises a plurality of electrically conductive wires selectively bonded to said interconnections along said first surface.

References Cited

UNITED STATES PATENTS

| | | | |
|---|---|---|---|
| 3,158,788 | 11/1964 | Last | 317—101 |
| 3,211,972 | 10/1965 | Kilby et al. | 317—235 |
| 3,290,753 | 12/1966 | Chang | 29—25.3 |
| 3,320,485 | 5/1967 | Buie | 317—101 |
| 3,332,137 | 7/1967 | Kenney | 29—423 |
| 3,335,338 | 8/1967 | Lepselter | 317—234 |
| 3,341,743 | 9/1967 | Ramsey | 317—101 |
| 3,343,255 | 9/1967 | Donovan | 29—577 |
| 3,354,360 | 11/1967 | Campagna et al. | 317—234 |
| 3,372,063 | 3/1968 | Suzuki | 148—1.5 |
| 3,100,276 | 8/1963 | Meyer | 317—234 |
| 3,411,051 | 11/1968 | Kilby | 317—235 |

JOHN W. HUCKERT, Primary Examiner

S. BRODER, Assistant Examiner